United States Patent
Goux

(10) Patent No.: US 11,075,337 B2
(45) Date of Patent: Jul. 27, 2021

(54) INTEGRATED CIRCUIT DEVICES BASED ON METAL ION MIGRATION AND METHODS OF FABRICATING SAME

(71) Applicant: IMEC vzw, Leuven (BE)

(72) Inventor: Ludovic Goux, Hannut (BE)

(73) Assignee: IMEC vzw, Leuven (BE)

( * ) Notice: Subject to any disclaimer, the term of this patent is extended or adjusted under 35 U.S.C. 154(b) by 31 days.

(21) Appl. No.: 16/560,777

(22) Filed: Sep. 4, 2019

(65) Prior Publication Data
US 2020/0075849 A1    Mar. 5, 2020

(30) Foreign Application Priority Data

Sep. 5, 2018 (EP) .................................... 18306168

(51) Int. Cl.
| | | |
|---|---|---|
| *H01L 45/00* | (2006.01) | |
| *C23C 16/04* | (2006.01) | |
| *C23C 16/455* | (2006.01) | |

(52) U.S. Cl.
CPC .......... *H01L 45/085* (2013.01); *C23C 16/045* (2013.01); *C23C 16/45525* (2013.01); *H01L 45/143* (2013.01); *H01L 45/144* (2013.01); *H01L 45/146* (2013.01); *H01L 45/1616* (2013.01); *H01L 45/1683* (2013.01)

(58) Field of Classification Search
CPC ... H01L 45/085; H01L 45/143; H01L 45/144; H01L 45/146; H01L 45/1616; H01L 45/1683; H01L 21/288; H01L 21/2885; H01L 21/445; H01L 51/0006; C23C 16/045; C23C 16/45525
See application file for complete search history.

(56) References Cited

U.S. PATENT DOCUMENTS

| | | |
|---|---|---|
| 9,076,723 B1 | 7/2015 | Matsunami et al. |
| 2006/0139989 A1 | 6/2006 | Gruning Von Schwerin et al. |
| (Continued) | | |

FOREIGN PATENT DOCUMENTS

| | | |
|---|---|---|
| EP | 3 029 683 | 6/2016 |
| FR | 3 003 401 | 9/2014 |
| JP | 2013-175524 | 9/2013 |

OTHER PUBLICATIONS

Search Report dated Feb. 28, 2019 in European Patent Application No. 18 30 6168; 9 pages.

*Primary Examiner* — Julia Slutsker
(74) *Attorney, Agent, or Firm* — Knobbe, Martens, Olson & Bear, LLP

(57) ABSTRACT

The disclosed technology generally relates to integrated circuit (IC) devices and more particularly to IC devices based on metal ion migration, and to manufacturing of the IC devices. In one aspect, a method of manufacturing an integrated electronic circuit, which includes at least one component based on metal ion migration and reduction, allows improved control of an amount of the metal which is incorporated into the component. This amount is produced from a metal supply layer and transferred into a container selectively with respect to the rest of the component. The container is configured as part of an electrolyte portion or active electrode in the final component. The method is compatible with two-dimensional and three-dimensional configurations of the component.

20 Claims, 4 Drawing Sheets

(56) References Cited

U.S. PATENT DOCUMENTS

| | | |
|---|---|---|
| 2009/0213643 A1* | 8/2009 | Angerbauer ........ G11C 11/5678 365/163 |
| 2009/0218567 A1 | 9/2009 | Mathew et al. |
| 2011/0121254 A1* | 5/2011 | Dressier ................ H01L 45/085 257/4 |
| 2012/0133026 A1 | 5/2012 | Yang et al. |
| 2015/0140777 A1 | 5/2015 | Imonigie et al. |
| 2015/0213887 A1 | 7/2015 | Ota et al. |
| 2017/0077100 A1* | 3/2017 | Takahashi ........... H01L 27/2481 |
| 2018/0061890 A1 | 3/2018 | Tada et al. |

* cited by examiner

INTEGRATED CIRCUIT DEVICES BASED ON METAL ION MIGRATION AND METHODS OF FABRICATING SAME

CROSS-REFERENCE TO RELATED APPLICATIONS

This application claims foreign priority to European Patent Application No. EP 18306168.8, filed Sep. 5, 2018, the content of which is incorporated by reference herein in its entirety.

BACKGROUND

Field

The disclosed technology generally relates to integrated electronic circuit (IC) devices and more particularly to an IC devices including a component based on metal ion migration, and to manufacturing of the IC devices.

Description of the Related Technology

Conductive bridge random access memory (CBRAM) technology has been identified as a promising technology for the future technologies, in particular for future memory or storage technologies. In some implementations, CBRAM can be integrated in arrays with cross-point design. A bit is stored in a CBRAM memory element as an electrical conduction state which may be switched between a relatively low conduction state and a relatively higher conduction state. The switching between different conduction states may occur in an electrolyte portion which is in electrical contact with two separate electrodes. Metal ions such as copper or nickel ions are soluble in the electrolyte portion, and can migrate therein. Then, when one of the electrodes, called inert electrode, is negatively polarized, the metal ions form continuous tracks which extend between both electrodes, and transform into metal filaments when the tracks reach the inert electrode. The resulting inter-electrode resistance value is very low, and remains such as long as a reversed polarization is not applied. When a suitable reversed polarization is applied, the metal atoms transform back into ions and migrate away from the inert electrode. The inter-electrode resistance value becomes high again.

Such component based on metal ion migration and reduction may be of two types depending on the source of the metal ions which migrate within the electrolyte portion toward the inert electrode. In the first type, the metal ions may originate from the electrode other than the inert electrode, e.g., through oxidation at the contact interface between the other electrode and the electrolyte portion. Such other electrode is commonly called active electrode, because material thereof in involved in the oxidation-reduction transformation. Such active electrode is different from the electrolyte portion, and the active electrode and the inert electrode are both in contact with the electrolyte portion, for example on opposed sides thereof. In the second type, both electrodes may be inert electrodes arranged apart from each other in contact with the electrolyte portion, and the metal ions are permanently contained within the electrolyte portion, transforming reversibly therein into metal filaments. Switching operation for storing 0- or 1-bit value through resistance value is unchanged.

At least two issues are to be addressed when manufacturing an integrated electronic circuit which includes such component.

The first issue is controlling the metal amount for each component, so that operation features are close to being identical or practically identical between several components designed to be similar within one and same integrated circuit, and also identical between circuit units that are manufactured successively using unchanged manufacture control parameters.

The second issue is avoiding implementing a dry-etch process for removing a material which contains some of the metal atoms. Indeed, the metal atoms may produce unwanted material depositions within the etching tool when being etched, which may increase the frequency of cleaning operations of the inside of the etching chamber. The manufacture throughput may be reduced for this reason, which may in turn increase the price of the integrated circuit including the CBRAM.

In addition, an object of the present disclosed technology may be combining components based on metal ion migration and reduction with a reduction in the substrate area which is occupied by a set of such components.

SUMMARY OF CERTAIN INVENTIVE ASPECTS

For meeting at least one of these objects or others, the disclosed technology in one aspect is directed to a method of manufacturing an integrated electronic circuit which includes at least one component based on metal ion migration and reduction. The method comprises the following steps:

/1/ selecting a metal and a first material which is different from the metal and capable of containing ions or atoms of the metal, and also selecting at least one second material so that each second material is electrically insulating and has a capacity of containing the metal ions or metal atoms which is less than that of the first material;

/2/ on a substrate of the integrated circuit, forming at least one portion of the first material, called container, and at least one portion of the at least one second material, called boundary portion, so that the container and the boundary portion are next to each other;

/3/ depositing a layer on the substrate provided with the container and the boundary portion, said layer containing ions or atoms of the metal and being called supply layer, so that a path from the supply layer to the container is available for some of the ions or atoms of the metal;

/4/ activating a moving of some of the ions or atoms of the metal that are contained in the supply layer, the moving occurring from the supply layer into at least part of the container selectively with respect to each boundary portion; and /5/ removing the supply layer from the integrated circuit, while leaving the ions or atoms of the metal that have moved in step /4/ into the container.

In various implementations of the disclosed technology, the container may be an active electrode, or at least part of an electrolyte portion of the component, or any other part of the component except for the boundary portion.

According to a first feature of the disclosed technology, the method further comprises depositing an electrode portion, called inert electrode, on the integrated circuit being manufactured, so that the component based on metal ion migration and reduction comprises at least the container and the inert electrode. The component based on metal ion migration and reduction is arranged so that metal ions produce metal filaments from the inert electrode within the electrolyte portion when a negative voltage is applied to the inert electrode with respect to the container during an operation of the component, if the container acts as the active electrode capable of transferring electrons outwards in addition to supplying the metal ions or atoms for forming the metal filaments. This corresponds to the first component type described above. Alternatively, for the second component type, the negative voltage is applied to the inert electrode with respect to a reference electrode which is in contact with the electrolyte portion separately from the inert electrode, if the container forms at least part of the electrolyte portion.

According to a second feature of the disclosed technology, the inert electrode when the container acts as an active electrode, or each of the inert electrode and the reference electrode when the container forms at least part of the electrolyte portion, is either not yet formed on the substrate of the integrated circuit before step /5/ has been completed, or isolated from the supply layer by the container or the at least one boundary portion during step /4/.

In this way, the metal amount within each component is set in step /4/, in a well-defined manner since only the container participates to hosting metal at this time. In particular, the inert electrode and the reference electrode are not polluted with metal atoms during step /4/.

In addition, step /5/ may be carried out using a removal process other than a dry-etching process. In particular, the supply layer may be removed in step /5/ using a wet etching process or a chemical-mechanical polishing process.

In various implementations of the disclosed technology, the following additional features may be implemented, each separately of in combination of several of them:

the component based on metal ion migration and reduction may form at least part of a conductive bridging random access memory element, or of a volatile conductive bridge, or of a switch;

the at least one container may be the only part of the component based on metal ion migration and reduction, which is in contact with the supply layer during step /4/, in addition to the boundary portion(s);

the moving of some of the ions or atoms of the metal may be activated in step /4/ through heating of the integrated circuit;

the container may be formed in step /2/ so that it is free of ions and atoms of the metal as resulting directly from this step /2/. In such case, the forming of the container in step /2/ may comprise etching a layer of the first material using a dry-etching process. High integration level is thus possible as the dimensions of the container are defined by lithographic patterning using state-of-the art tools;

the boundary portion as formed in step /2/ may surround the container, laterally with respect to the path of the metal ions or atoms from the supply layer to the container;

the disclosed technology method may further comprise, between steps /2/ and /3/, depositing an additional layer called liner, of a material which is permeable to the metal ions or atoms during step /4/, for example a liner of tantalum or titanium, so that the liner is intermediate between each container and the supply layer after step /3/. Then, step /5/ further comprises removing the liner after the supply layer. Such liner may help in controlling the metal amount which is inserted into each container, and/or in controlling a process which is implemented for removing the supply layer in step /5/;

the metal may be copper, nickel or silver, the supply layer possibly being a layer of this metal; and the second material may be silicon nitride, aluminum nitride or a mixed nitride of silicon and aluminum.

The container may act as an active electrode for the first component type, and the first material may be silicon, germanium or tellurium.

Alternatively, the container may form at least part of the electrolyte portion, corresponding to the second component type recited above. Then, the first material may be an oxide, in particular a tungsten oxide or a silicon oxide, or the first material may be a chalcogenide, in particular germanium telluride or germanium selenide.

In first possible implementations of the disclosed technology, according to so-called 2D-configurations, the container and the boundary portion may be next to each other along at least one direction which is parallel to a surface of the substrate, this surface supporting the component based on metal ion migration and reduction in the integrated circuit. Optionally for such first possible implementations of the disclosed technology, the disclosed technology method may further comprise forming an electrolyte portion different from the container, so that this electrolyte portion different from the container is between the reference electrode or active electrode and the inert electrode along a direction perpendicular to the substrate surface.

In second possible implementations of the disclosed technology, according to so-called 3D-configurations, step /2/ may comprise forming a stack of several containers and several boundary portions which are alternated along a stacking direction which is perpendicular to a surface of the substrate, this surface supporting the stack. In such case, the method may further comprise, between steps /2/ and /3/, etching a trench or shaft through the containers and boundary portions, parallel to the stacking direction. Then, the supply layer may be deposited in step /3/ as a conformal layer on sidewalls of the trench or shaft, and at least part of the inert electrode is deposited within this trench or shaft so as to fill it at least partially. Such inert electrode is thus common to several components each based on migration and reduction of the metal ions but each corresponding to a respective one of the containers. Optionally for such second possible implementations of the disclosed technology, the method may further comprise, after step /5/ but before the inert electrode is deposited, depositing an electrolyte portion different from the containers as another conformal layer on the sidewalls of the trench or shaft, so that this electrolyte portion different from the container is in contact with the containers through the sidewalls of the trench or shaft, and also in contact with the inert electrode in the trench or shaft. Such electrolyte portion different from the containers is then also common to the components each based on migration and reduction of the metal ions but each corresponding to a respective one of the containers.

These and other features of the disclosed technology will be now described with reference to the appended figures, which relate to preferred but not-limiting implementations of the disclosed technology.

BRIEF DESCRIPTION OF THE DRAWINGS

For clarity sake, element sizes which appear in these figures do not correspond to actual dimensions or dimension ratios. Also, same reference numbers which are indicated in different ones of these figures denote identical elements of elements with identical function.

DETAILED DESCRIPTION OF CERTAIN ILLUSTRATIVE EMBODIMENTS

An integrated circuit device including a component based on metal ion migration according to various embodiments is disclosed herein. Such component may be implemented in various memory and logic devices, including a conductive bridging random access memory (CBRAM), a volatile conductive bridge (VCB) or a switch, among other devices.

Figure 1A:
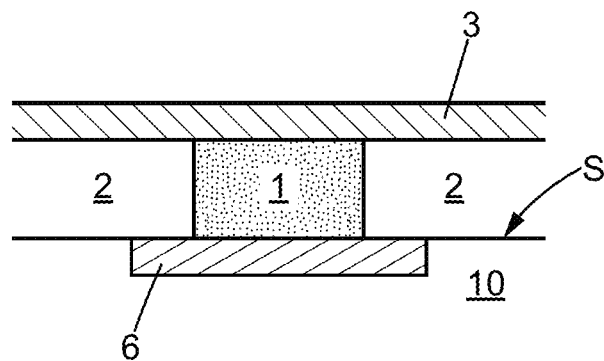
FIGS. 1a-1c are cross-sectional views of intermediate structures during fabrication of an integrated circuit, according to a first two-dimensional implementation of the disclosed technology.

According to FIG. 1a, an integrated circuit substrate 10 has a planar upper surface S. The substrate 10 may have been processed beforehand so that it is electrically insulating at its surface S outside of an electrode 6. The electrode 6 may be flush with the substrate surface S. For example, the electrode 6 may be copper-based or formed of titanium nitride (TiN), and may be surrounded with silica ($SiO_2$) material within the substrate 10. Then a pattern of at least one portion 1 of a first material is formed on the surface S, on the electrode 6, and surrounded by a layer portion of a second material 2. The first material portion 1 may be intended to form the electrolyte portion in the final component, and be the container in the implementation described now, and the second material layer portion 2 may be intended to form a boundary portion such that metal atoms are obstructed from migrating out of the portion 1, e.g., in a direction parallel to the surface S. Thus, atoms or ions of the metal exhibit solubility and mobility in the first material, whereas they can almost not be incorporated into the second material. As disclosed previously, for example from EP 3 029 683, and without being bound to any theory, the mobility of the metal atoms or ions can be assessed through the coefficient $D_0$ as appearing in the Arrhenius equation for the diffusion coefficient $D=D_0 \cdot \exp(-E_a/k_B T)$, where $E_a$ is the activation energy, $k_B$ is the Boltzmann constant and T is the temperature. The value for the coefficient Do should be greater by several orders for the metal atoms and ions in first material used for the electrolyte portion 1, when compared to the same metal but in the second material used for the boundary portion 2.

Suitable metal may be copper (Cu), nickel (Ni), or silver (Ag), to name a few.

The first material for the electrolyte portion 1 may be a dielectric material such as porous silicon oxide ($SiO_x$) tungsten oxide ($WO_x$), or another oxide, or may be a chalcogenide material such as germanium telluride (GeTe), germanium selenide (GeSe), germanium sulfide (GeS), silicon telluride (SiTe), etc. Metal ions or atoms are mobile within such first material, for example when submitted to an electrical field, and can transform reversibly from ions to atoms.

The second material for the boundary portion 2 may be silicon nitride ($Si_3N_4$), aluminium nitride (AlN), mixed silicon and aluminium nitride, dense silica such as thermal silica, etc., among other dielectric materials.

The electrolyte portion 1 may be formed at first on the surface S, for example through material layer deposition and selective dry-etching using a mask, and then embedded within a layer of the second material. The first material, e.g., the electrolyte material, and the second material are thus initially deposited free of metal content. Then, the upper surface of the layer of the second material can be planarized, for example using a chemical-mechanical polishing process (CMP), until the electrolyte portion 1 becomes exposed. Preferably, the boundary portion 2 surrounds the electrolyte portion 1 in projection onto the surface S.

A layer 3 of a metal-containing material is then deposited on the electrolyte portion 1 and the boundary portion 2, on surfaces that are opposite to the interfaces formed with the substrate 10. For example, if the metal is copper, the layer 3 may be a copper layer, or a layer of copper telluride (CuTe), copper-germanium telluride (CuGeTe), an alloy of copper and germanium, etc. Circuit configuration shown in FIG. 1a is thus obtained.

Figure 1B:
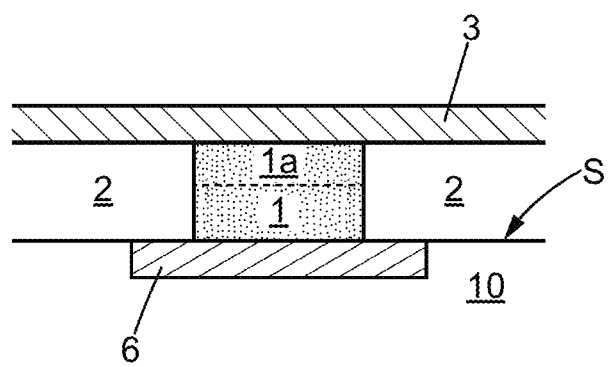

The integrated circuit may be heated for a controlled duration and at a controlled temperature, so that a controlled amount of metal diffuses from the layer 3 into the electrolyte portion 1, selectively with respect to the boundary portion 2. The diffusion path is mainly oriented perpendicular to the surface S. At the end of the heating step, the electrolyte portion 1 contains a controlled amount of the metal, whereas the boundary portion 2 does not. The heating duration may also be controlled so that metal atoms originating from the layer 3 do not reach the electrode 6 during the heating. Circuit configuration as shown in FIG. 1b is obtained, where reference sign 1a denotes a part of the electrolyte portion 1 which has been penetrated by metal atoms during the heating step. The layer 3 serves the function of a supply layer for the metal atoms penetrated into the electrolyte portion 1, and this latter serves the function of a container for the metal atoms to remain in the final circuit.

Also the material of the electrode 6 may have been selected so that metal atoms which would thermally diffuse through the whole electrolyte portion 1 and reach the electrode 6 do not penetrate this latter. Thus the metal amount which is absorbed into the existing part of the circuit is even more controlled.

Then the layer 3 as existing after the heating step is removed from the circuit, for example using a suitable chemical-mechanical polishing process (CMP). The removal process is continued until the electrolyte portion 1 and the boundary portion 2 are exposed. The component is completed in a next step by forming another electrode 5 above the electrolyte portion 1, and in contact with it. For such structure of the component based on migration and reduction of the metal ions, both electrodes 5 and 6 may be inert electrodes, which may be formed of the same or different material. A negative electrical polarization may be applied to any one of the electrodes 5 and 6 with respect to the other one for forming metal filaments within the electrolyte portion 1, and thus producing the low electrical resistance value between both electrodes 5 and 6. The electrode 5 corresponds to the inert electrode as mentioned in the general part of this description, and the electrode 6 is reference electrode.

For example, a component based on metal ion migration and reduction as described with reference to FIGS. 1a-1c may be a conductive bridging RAM. In some embodiments, the electrode 5 may be part of one of a word line or a bit line, and the electrode 6 may be part of the other of the word line and the bit line.

The component may also be a volatile conductive bridge, which can be used as a selector device in a memory point array.

Possibly, a first component forming a conductive bridging RAM may be combined in series with a second component forming a volatile conductive bridge, thereby forming a serial selector in a memory cell, according to a 1—selector 1—resistor configuration. Both first and second components may have been each obtained according to the disclosed technology.

Figure 1C:
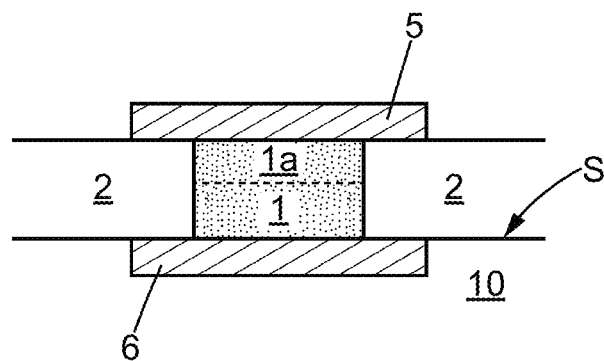
Figure 2A:
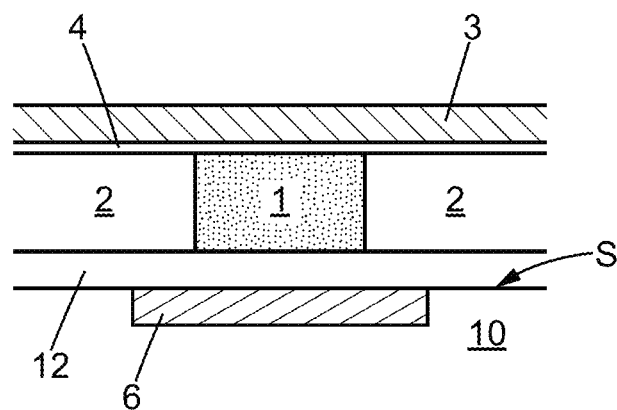
FIGS. 2a-2c correspond to FIGS. 1a-1c, respectively, for a second two-dimensional implementation of the disclosed technology.
Figure 2B:
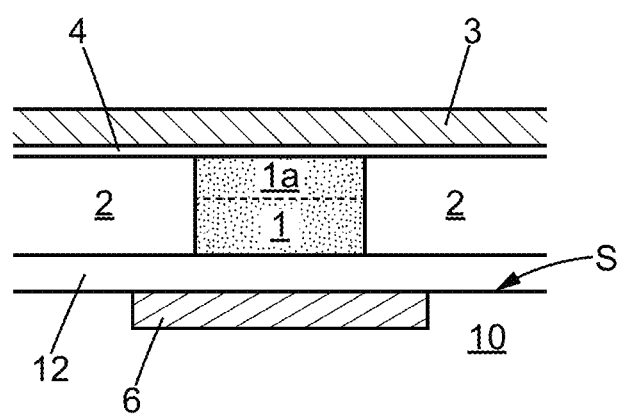
Figure 2C:
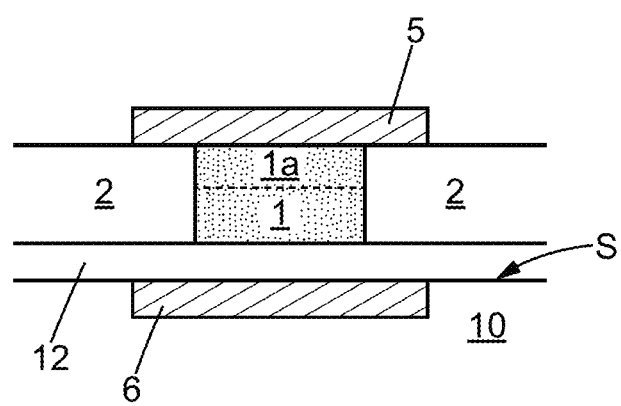

FIGS. 2a-2c show two optional improvements of the disclosed technology which may be used independently from each other or in combination, in addition to the implementation as illustrated by FIGS. 1a-1c.

The first improvement includes using an additional electrolyte portion between the electrolyte portion 1 and one of the electrodes 5 or 6. FIG. 2a illustrates such additional electrolyte portion as a layer 12 located between the electrode 6 and the electrolyte portion 1. Such layer 12 is to be deposited on the surface S of the substrate 10 before the electrolyte portion 1 and the boundary portion 2 are formed. Alternatively or in combination, another additional electrolyte portion (not represented) may be deposited on the electrolyte portion 1 and the boundary portion 2 after the supply layer 3 has been removed but before the electrode 5 is deposited. A possible material for such additional electrolyte portions may include or be formed of a dielectric material, e.g., a porous aluminium oxide ($Al_2O_3$), or a chalcogenide material.

The second improvement includes using an additional layer 4 which is located between the electrolyte portion 1 and the supply layer 3, as represented in FIG. 2a. Such additional layer 4 may also extend on the boundary portion 2. Therefore, it is to be deposited on the electrolyte portion 1 and the boundary portion 2 after these latter have been planarized but before the supply layer 3 is deposited. The additional layer 4 thus intersects the path of the metal atoms from the supply layer 3 to the electrolyte portion 1. The material and thickness of such layer 4, also called liner, are to be selected so that the layer 4 controls the amount of metal atoms that travels from the supply layer 3 to the electrolyte portion 1 during the heating step. Improved control of this metal amount is provided by implementing the layer 4, thanks to the permeability of the layer 4 to the metal atoms. For example, the layer 4 may include or be formed of a titanium (Ti) layer or a tantalum (Ta) layer, among other metals, and its thickness may be 2-3 nm (nanometers).

An additional function of the optional layer 4 may be forming a stop layer effective during the removal of the supply layer 3 after metal diffusion has been performed. The progression of the CMP process which is implemented for removing the supply layer 3 stops when the abrasion surface has reached the layer 4, due to the difference in composition between the layers 3 and 4. The layer 4 may be removed after the layer 3 using another etching process suitable for the composition of the layer 4. Appropriate wet etching process may be implemented for example.

FIG. 2b shows the configuration of the circuit being manufactured just after the heating step, and FIG. 2c corresponds to the configuration of the circuit once the component has been completed.

Figure 3A:
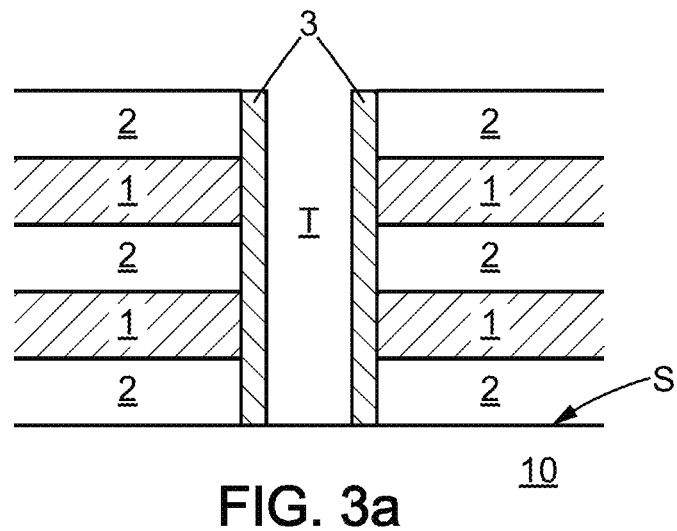
FIGS. 3a-3c are cross-sectional views of intermediate structures during fabrication of another integrated circuit, according to a first three-dimensional implementation of the disclosed technology.
Figure 3B:
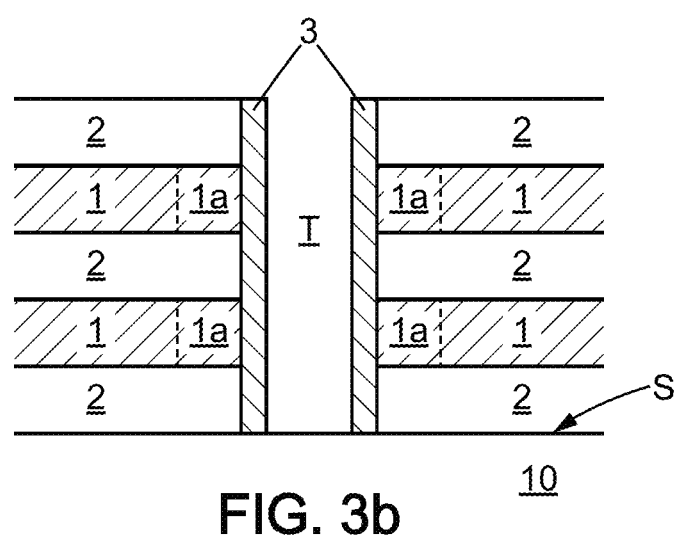
Figure 3C:
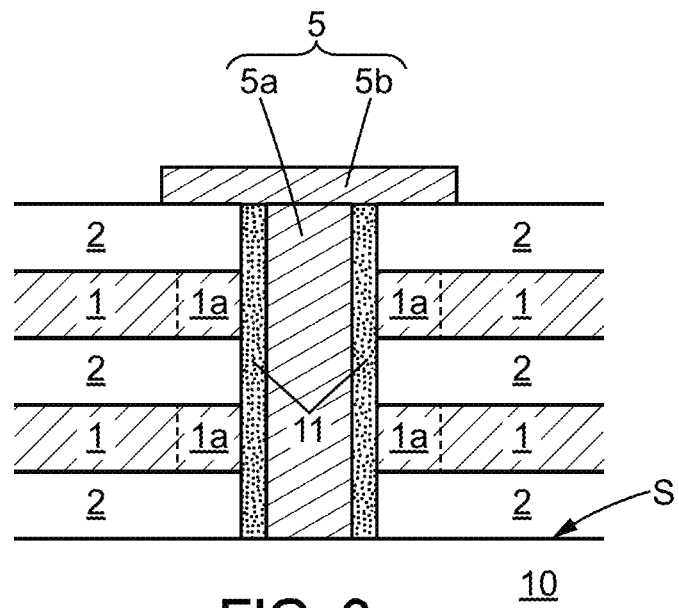

FIGS. 3a-3c illustrate another implementation of the disclosed technology in which the material portion which has the function of container for the metal atoms is an active electrode for the final component. The integrated circuit substrate 10 has a planar upper surface S as described above. It may have been processed for forming a stack of alternated layers 1 and 2, possibly starting with one layer 2 in particular if the substrate 10 is electrically conducting at its surface S. Then a trench, via or shaft T is etched through the stack, perpendicular to the surface S and until this latter is reached at the bottom of the trench T. A directional dry etching process may be used for forming the trench T, in a suitable manner through the stack of alternating layers 1 and 2 formed of different materials. Until this stage of the manufacturing method, the integrated circuit does not contain any amount of the metal to be implemented as migrating and redox species in the final component. Then the supply layer 3 is deposited as a conformal layer in the trench T, for example using an atomic layer deposition (ALD) process which may be particularly suitable for lining a trench or via with a high aspect ratio. The circuit configuration shown in FIG. 3a is obtained.

In an analogous manner as described above with respect to two-dimensional (2D) implementations of the disclosed technology, the material of the supply layer 3 may include copper, nickel, silver, copper telluride (CuTe), copper-germanium telluride (CuGeTe), an alloy of copper and germanium, etc. The layers 1 are intended to host metal atoms for forming active layers. Their constituting material, referred to herein as a first material, is thus selected for producing solubility for the metal atoms. The layers 2 are intended to act as boundary portions, and thus comprised of a second material which is not permeable to the metal atoms originating from the supply layer 3. The first and second materials, of the layers 1 and 2 respectively, may be selected as described above in connection with FIG. 1a. For example, the first material for the layers 1 may be silicon (Si), and the second material for the layers 2 may be silicon nitride ($Si_3N_4$).

The integrated circuit is then heated during a controlled duration and at a controlled temperature, for causing metal atoms to diffuse from the supply layer 3 into the layers 1. In contrast to the 2D implementations described above, the diffusion paths are now oriented parallel to the surface S. At the end of the heating step, the layers 1 each contain a controlled amount of the metal, whereas the boundary portions 2 do not. These metal amounts are located close to the trench T, in parts of the layers 1 which are denoted 1a in FIG. 3b. In the parts 1a, the material may be been transformed into copper silicide during the heating step.

The supply layer 3 is then removed, for example using a wet etching process. A conformal layer 11 of an electrolyte material is deposited in the trench T in a next step, for example using a suitable ALD deposition process. Then, the electrolyte material may be removed from the bottom of the trench T, for example using a directional dry etching process. The material of the electrolyte layer 11 may be a dielectric material such as an oxide, e.g., porous silica ($SiO_2$) or tungsten oxide (WO), or may be a chalcogenide. Then an electrically conductive material is deposited within the trench T, for at least partially filling it. It forms an inner electrode 5a as shown in FIG. 3c. A CMP process may be implemented thereafter, for removing layer portions of the electrolyte material and of the conductive material which are present on the highest layer 2. Finally, a top electrode portion 5b is formed above the inner electrode 5a, so as to be in electrical contact with this latter. The inner electrode 5a and the top electrode portion 5b form together the inert electrode 5 of the component.

During an operation of such circuit, each layer 1 forms a respective active electrode which pertains to a different component based on metal ion migration and reduction. The inert electrode 5 is common to these components. When a positive voltage is applied to one of the layers 1 with respect to the inert electrode 5, so that this latter appears to be polarized negatively, copper atoms come out of the layer 1, are oxidized at the interface with the electrolyte layer 11, and then migrate through the electrolyte layer 11 until some of them reach the inner electrode 5a. The copper ions are reduced from the interface between the electrolyte layer 11 and the inner electrode 5a, thus forming metal filaments through the electrolyte layer 11. The electrical resistance value which exists between the layer 1 of concern and the inert electrode 5 is then low. Inverting the electrical polarization between the layer 1 and the inert electrode 5, so that this latter is now positively biased, produces oxidation of the copper atoms which are inside the electrolyte layer 11 or at the interface thereof with the inner electrode 5a. The metal ions then migrate back to the layer 1, and penetrate into the part 1a of this latter to form recovered copper silicide. In this way, the parts 1a of the layers 1 which have the function of containers for the metal atoms in the manufacturing method of the disclosed technology have the function of active electrodes during operations of the final component.

In alternative implementations of the disclosed technology, the silicon material of the layers 1 may be replaced with germanium material, or tellurium, or germanium telluride. An advantage thereof is an improved soaking of the layers 1 by the metal atoms at the interface with the electrolyte layer 11.

In a manner similar to that illustrated by FIGS. 2a and 2b, a liner permeable to the metal atoms may be deposited in a conformal manner in the trench T, before the supply layer 3 is deposited. Such liner, for example a titanium (Ti) or tantalum (Ta) liner is thus inserted between the layers 1 and the supply layer 3. It allows controlling more accurately the amounts of metal atoms that diffuse into the layers 1 during the heating step.

Figure 4A:
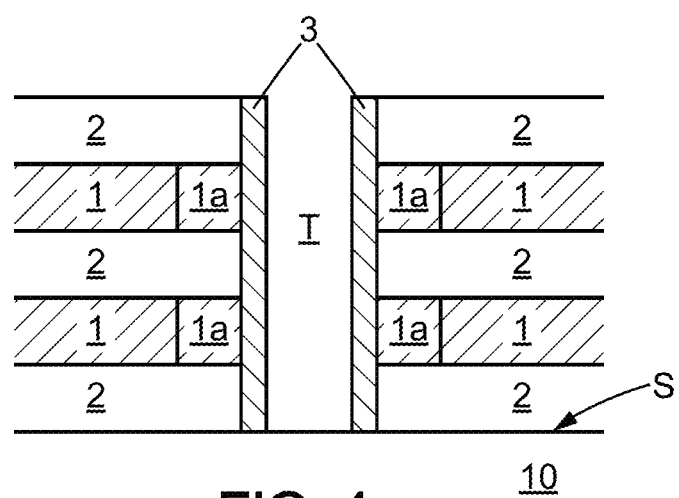
FIG. 4a corresponds to FIG. 3a for a second three-dimensional implementation of the disclosed technology.

FIG. 4a shows another improvement of the disclosed technology implementation of FIGS. 3a-3c. When forming initially the stack of the layers 1 and 2 on the surface S of the substrate 10, the material of the layers 1 may be different in composition in a vicinity of the trench T, as compared to the layers 1 away from the trench T. For example, each layer 1 may be comprised of a material optimized for electron transportation and electrical contact away from the trench T, and of another material which is optimized for metal atom insertion and soaking around the trench T. Hence, this another material will have the function of active material during an operation of the final component. For example, the silicon material of each layer 1 may be replaced with a chalcogenide-based active material, for example germanium telluride (GeTe), in an area which is centred on the trench T parallel to the surface S, but wider in diameter than the trench T. Then, the trench T is etched through the layers 2 and these portions of active material at the levels of the layers 1. Remaining parts of the active material portions surround the trench T parallel to the surface S, and are intended to operate similar to the parts 1a of FIGS. 3b and 3c for hosting the metal atoms. After the supply layer 3 has been deposited in a conformal manner within the trench T, the circuit configuration according to this improvement is that shown in FIG. 4a. The circuit manufacturing method can then be continued as described before in connection with the FIGS. 3b (just after the heating step) and 3c (forming of the inert electrode completed).

A person skilled in the art will understand than the implementations of the disclosed technology described above can be varied for secondary aspects thereof, while maintaining the advantages which have been cited. In particular, component configurations using at least one active electrode can be combined with 2D configurations. Also, component configurations without active electrode, but with reference electrode, can be combined with 3D configurations.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of manufacturing an integrated electronic circuit, the integrated electronic circuit including at least one component based on metal ion migration and reduction, wherein the method comprises:
   providing a metal;
   providing a first material different from the metal, wherein the first material has a first capacity of containing metal ions or metal atoms of the metal;
   providing at least one second material so that each of the at least one second material is electrically insulating and has a second capacity of containing the metal ions or metal atoms of the metal, wherein the second capacity is less than the first capacity of the first material;
   forming on a substrate of the integrated electronic circuit a container comprising at least one portion of the first material and a boundary portion comprising at least one portion of the at least one second material, wherein the container and the boundary portion are next to each other;
   depositing a supply layer over and overlapping the container and the boundary portion, the supply layer containing the metal ions or metal atoms of the metal, such that a path from the supply layer to the container is available for some of the metal ions or metal atoms of the metal;
   activating a movement of some of the metal ions or metal atoms of the metal in the supply layer into at least part of the container selectively with respect to the boundary portion;
   removing the supply layer over and overlapping the container and the boundary portion, while leaving behind the metal ions or metal atoms of the metal that have moved into the container from the supply layer; and depositing an inert electrode over the container and the boundary portion.

2. The method of claim 1, wherein the component based on metal ion migration and reduction is arranged such that in response to a voltage applied to the inert electrode, metal ions form metal filaments from the inert electrode within an electrolyte portion during an operation of the component, wherein the voltage is negative with respect to the container serving as an active electrode capable of transferring electrons outwards in addition to supplying the metal ions or metal atoms for forming the metal filaments, or wherein the voltage is negative with respect to a reference electrode in contact with the electrolyte portion separately from the inert electrode and the container forms at least part of the electrolyte portion, and wherein the inert electrode when the container serves as an active electrode, or each of the inert electrode and the reference electrode when the container forms at least part of the electrolyte portion, is either not yet formed on the substrate of the integrated electronic circuit before removing the supply layer, or isolated from the supply layer by the container or the boundary portion during activating the movement of some of the metal ions or metal atoms of the metal.

3. The method of claim 1, wherein the component based on metal ion migration and reduction forms at least part of a conductive bridging random access memory element, a volatile conductive bridge or a switch.

4. The method of claim 1, wherein the container is an only part of the component based on metal ion migration and reduction that is in contact with the supply layer during activating the movement of some of the metal ions or metal atoms of the metal.

5. The method of claim 1, wherein activating the movement of some of the metal ions or metal atoms of the metal comprises heating the integrated electronic circuit.

6. The method of claim 1, wherein the container is free of the metal ions and metal atoms of the metal prior to depositing the supply layer.

7. The method of claim 6, wherein forming the container comprises dry-etching a layer of the first material.

8. The method of claim 1, wherein the boundary portion laterally surrounds the container.

9. The method of claim 1, wherein the container and the boundary portion are next to each other along at least one direction parallel to a major surface of the substrate, the major surface supporting the at least one component based on metal ion migration and reduction in the integrated electronic circuit.

10. The method of claim 9, further comprising forming an electrolyte portion different from the container and between a reference electrode or active electrode and the inert electrode along a direction perpendicular to the major surface.

11. The method of claim 1, wherein forming the container and the boundary portion comprises forming a stack of a plurality of containers and a plurality of boundary portions that alternate along a stacking direction perpendicular to a major surface of the substrate, the major surface supporting the stack, wherein:

the method further comprises, after forming the container and the boundary portion and before depositing the supply layer, etching a trench or shaft through the containers and boundary portions, parallel to the stacking direction, depositing the supply layer comprises depositing as a conformal layer on sidewalls of the trench or shaft, and the method further comprises depositing at least part of the inert electrode within the trench or shaft so as to fill at least partially the trench or shaft, wherein the inert electrode is common to several components, and wherein each of the several components is based on migration and reduction of the metal ions and corresponds to a respective one of the containers.

12. The method of claim 11, further comprising, after removing the supply layer but before depositing the inert electrode, depositing an electrolyte portion different from the container as another conformal layer on the sidewalls of the trench or shaft, such that the electrolyte portion is in contact with the containers through the sidewalls of the trench or shaft and in contact with the inert electrode in the trench or shaft, wherein the electrolyte portion is common to the components, and wherein each of the components is based on migration and reduction of the metal ions and corresponds to a respective one of the containers.

13. The method of claim 1, wherein removing the supply layer comprises removing by a wet etching process or a chemical-mechanical polishing process.

14. The method of claim 1, further comprising, after forming the container and the boundary portion and before depositing the supply layer, depositing a liner intermediate between the container and the supply layer, the liner formed of a material which is permeable to the metal ions or metal atoms during activating the movement of some of the metal ions or metal atoms of the metal in the supply layer, and wherein removing the supply layer further comprises removing the liner after removing the supply layer.

15. The method of claim 1, wherein the metal is selected from the group consisting of copper, nickel and silver.

16. The method of claim 15, wherein the supply layer is a layer of the metal.

17. The method of claim 1, wherein the second material is selected from the group consisting of silicon nitride, aluminum nitride and a mixture thereof.

18. The method of claim 1, wherein the container serves as an active electrode, and the first material is silicon, germanium, or tellurium.

19. The method of claim 1, wherein the container forms at least part of an electrolyte portion, and the first material is an oxide or a chalcogenide.

20. The method of claim 19, wherein the oxide comprises a tungsten oxide or a silicon oxide, and wherein the chalcogenide comprises a germanium telluride or a germanium selenide.

* * * * *